United States Patent
Oikawa et al.

(10) Patent No.: US 8,592,260 B2
(45) Date of Patent: Nov. 26, 2013

(54) PROCESS FOR PRODUCING A SEMICONDUCTOR DEVICE

(75) Inventors: Masami Oikawa, Kisarazu (JP); Takeshi Matsumura, Ibaraki (JP); Sadahito Misumi, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 125 days.

(21) Appl. No.: 12/492,641

(22) Filed: Jun. 26, 2009

(65) Prior Publication Data
US 2010/0330745 A1 Dec. 30, 2010

(51) Int. Cl.
H01L 21/50 (2006.01)

(52) U.S. Cl.
USPC .................................. 438/119; 257/E21.499

(58) Field of Classification Search
USPC .................. 438/119; 257/E21.499, 257/E21.509–E21.513, E23.024, E23.025
See application file for complete search history.

(56) References Cited

U.S. PATENT DOCUMENTS

| | | | |
|---|---|---|---|
| 5,622,588 A | 4/1997 | Weber | |
| 5,798,014 A | 8/1998 | Weber | |
| 6,214,640 B1 | 4/2001 | Fosberry et al. | |
| 6,224,936 B1 | 5/2001 | Gochnour et al. | |
| 6,265,782 B1 | 7/2001 | Yamamoto et al. | |
| 6,303,219 B1 | 10/2001 | Sawamura et al. | |
| 6,352,879 B1 | 3/2002 | Fukui et al. | |
| 6,566,422 B1 | 5/2003 | Yagi et al. | |
| 6,652,688 B2 | 11/2003 | Matsumura et al. | |
| 7,232,709 B2 | 6/2007 | Misumi et al. | |
| 7,772,040 B2 | 8/2010 | Misumi et al. | |
| 8,236,614 B2 | 8/2012 | Misumi et al. | |
| 8,278,153 B2 | 10/2012 | Misumi et al. | |
| 2001/0022404 A1 | 9/2001 | Yamamoto et al. | |
| 2003/0102573 A1 | 6/2003 | Tanabe et al. | |
| 2003/0145949 A1 | 8/2003 | Tanaka et al. | |
| 2005/0156321 A1 | 7/2005 | Misumi et al. | |
| 2005/0227384 A1 | 10/2005 | Nagano et al. | |
| 2006/0243947 A1 | 11/2006 | Tsumura et al. | |
| 2006/0252234 A1 | 11/2006 | Saiki | |
| 2007/0098995 A1 | 5/2007 | Masuko et al. | |
| 2007/0205249 A1 | 9/2007 | Marsh et al. | |

(Continued)

FOREIGN PATENT DOCUMENTS

| | | |
|---|---|---|
| EP | 386909 A2 | 9/1990 |
| EP | 0 959 498 A1 | 11/1999 |

(Continued)

OTHER PUBLICATIONS http://en.wikipedia.org/wiki/Acrylic; http://en.wikipedia.org/wiki/Acryl_group.

(Continued)

Primary Examiner — Julio J Maldonado
Assistant Examiner — Daniel Shock
(74) Attorney, Agent, or Firm — Knobbe, Martens, Olson & Bear LLP

(57) ABSTRACT

The process for producing a semiconductor device of the invention is a process for producing a semiconductor device, comprising: a temporarily bonding step of bonding a semiconductor element temporarily on an adherend through an adhesive sheet, a semi-curing step of heating the adhesive sheet under predetermined conditions, thereby turning the sheet into a semi-cured state that the shearing adhering strength of the sheet to the adherend is 0.5 MPa or more, and a wire bonding step of causing the semiconductor element to undergo wire bonding in the state that the adhesive sheet is semi-cured.

15 Claims, 11 Drawing Sheets

(56) References Cited

U.S. PATENT DOCUMENTS

| | | |
|---|---|---|
| 2008/0064141 A1* | 3/2008 | Misumi et al. ............... 438/109 |
| 2009/0032976 A1 | 2/2009 | Misumi et al. |
| 2010/0264531 A1 | 10/2010 | Misumi et al. |
| 2012/0189845 A1 | 7/2012 | Misumi et al. |

FOREIGN PATENT DOCUMENTS

| | | |
|---|---|---|
| JP | 55-111151 | 8/1980 |
| JP | 5-095010 | 4/1993 |
| JP | 10-292163 | 11/1998 |
| JP | 10-335534 | 12/1998 |
| JP | 2000-104040 | 4/2000 |
| JP | 2001-223300 | 8/2001 |
| JP | 2001-313301 | 11/2001 |
| JP | 2002-093992 | 3/2002 |
| JP | 2002-105428 | 4/2002 |
| JP | 2002-118144 | 4/2002 |
| JP | 2002-134531 | 5/2002 |
| JP | 2002-179769 | 6/2002 |
| JP | 2002-261223 | 9/2002 |
| JP | 2003-264205 | 9/2003 |
| JP | 2003-297861 | 10/2003 |
| JP | 2004-043762 | 2/2004 |
| JP | 2005-19516 | 1/2005 |
| JP | 2005-183703 | 7/2005 |
| JP | 2008-205195 | 9/2008 |
| KR | 2000-0048963 | 7/2000 |
| KR | 2003-0014108 | 2/2003 |
| KR | 2004-0016855 | 2/2004 |
| TW | 288185 | 10/1996 |
| TW | 200502372 | 1/2005 |
| WO | WO 98/15975 | 4/1998 |
| WO | WO 02/089553 | 11/2002 |
| WO | WO 2004/030075 A1 | 4/2004 |

OTHER PUBLICATIONS

International Search Report issued on the corresponding(090APC)/related PCT Application No. PCT/JP2006/302948, dated May 23, 2006.

Semiconductor OneSource Semiconductor Glossary: Wire Bonding.

Wolf et al. (Silicon Processing for the VLSI Era, vol. 1: Process Technology. $2^{nd}$ Ed. Sunset Beach: Lattice Press, 2000. 853, Fig. 17-7).

File History of the related U.S. Appl. No. 11/853,743, as of Dec. 8, 2009.

File History of the related U.S. Appl. No. 11/816,696, as of Dec. 8, 2009.

File History of the related U.S. Appl. No. 11/853,743, for the period of Dec. 9, 2009-Sep. 8, 2010.

File History of the related U.S. Appl. No. 12/829,707, as of Sep. 8, 2010.

File History of the related U.S. Appl. No. 11/816,696, for the period of Dec. 9, 2009-Sep. 8, 2010.

File History of the related U.S. Appl. No. 12/829,707, for the period of Sep. 9, 2010-Feb. 24, 2011.

File History of the related U.S. Appl. No. 11/816,696, for the period of Sep. 9, 2010-Feb. 24, 2011.

* cited by examiner ern art, and an adhesive sheet used in the process.

PROCESS FOR PRODUCING A SEMICONDUCTOR DEVICE

BACKGROUND OF THE INVENTION

1. Field of the Invention

This application relates to Japanese Patent Application No. 2007-039667, filed Feb. 20, 2007. The disclosure of the aforementioned application is hereby incorporated by reference in its entirety.

The present invention relates to a process for producing a semiconductor device, and an adhesive sheet used in the process.

2. Background Art

In order to meet the request that semiconductor devices are made finer and caused to have higher functions, the wiring width of power supply lines arranged in the entire area of the main faces of their semiconductor chips (semiconductor elements) or the interval between signal lines arranged therein has been becoming narrower. For this reason, the impedance thereof increases or signals between signal lines of different nodes interfere with each other so as to cause hindrance to the exhibition of sufficient performances for the operation speed of the semiconductor chips, the margin of the operating voltage thereof, the resistance thereof against damage by electrostatic discharge, and others. In order to solve these problems, for example, in Japanese Unexamined Patent Publication S55-111151 and Japanese Unexamined Patent Publication 2002-261233, package structures wherein semiconductor elements are laminated are suggested.

As a material used to stick semiconductor elements to a substrate or the like, the following examples are suggested: an example wherein a thermosetting paste resin is used (see, for example, Japanese Unexamined Patent Publication 2002-179769); and examples wherein an adhesive sheet composed of a thermoplastic resin and a thermosetting resin is used (see, for example, Japanese Unexamined Patent Publication 2002-261233 and Japanese Unexamined Patent Publication 2000-104040).

In conventional processes for producing a semiconductor device, an adhesive sheet or an adhesive is used to cause a semiconductor element to adhere onto a substrate, a lead frame or a semiconductor element. The adhesion is attained by attaching the semiconductor element to the substrate or the like under pressure (die attachment), and then curing the adhesive sheet or the like through a heating step. Furthermore, wire bonding is performed to connect the semiconductor element electrically to the substrate. Thereafter, molding is conducted by use of a sealing resin, and then the resin is after-cured to attain sealing with the sealing resin.

However, when the wire bonding is performed, the semiconductor element on the substrate or the like is moved by ultrasonic vibration or heating. It is therefore necessary to conduct a heating step before the wire bonding to heat and cure the existing thermosetting paste resin or thermosetting adhesive sheet, thereby bonding the semiconductor element so as not to be moved.

About an adhesive sheet made of a thermosetting resin, or an adhesive sheet made of both of a thermosetting resin and a thermoplastic resin, a heating step is further required to keep the adhering strength certainly between the sheet and an adherend and to improve the wettability therebetween after the sheet undergoes die attachment and before the sheet undergoes wire bonding.

However, when the adhesive sheet or the like is heated before the wire bonding, there is caused a problem that a volatile gas is generated from the adhesive sheet or the like. The volatile gas contaminates the existing bonding pads. Thus, it becomes impossible to perform the wire bonding in many cases.

When the adhesive sheet or the like is heated and cured, curing shrinkage or the like is also generated in the adhesive sheet or the like. Following this, a stress is generated to cause a problem that the lead frame or substrate (as well as the semiconductor element) is warped. Additionally, in the wire bonding step, the stress results in a problem that the semiconductor element is cracked. As semiconductor elements have been becoming thinner and smaller in recent years, the thickness of the semiconductor elements has been becoming smaller so as to change from about 200 µm, which is a conventional thickness, to a value below the conventional thickness, or a value 100 µm or less. Considering the present situation, the problems that a substrate or the like is warped and a semiconductor element thereon is cracked become more serious. Thus, a solution against the problems has become more important.

SUMMARY OF THE INVENTION

The present invention has been made in light of the problems. An object thereof is to provide a process for producing a semiconductor device that makes it possible to make the yield better than in the conventional art, and an adhesive sheet used in the process.

In order to solve the above-mentioned problems, the present inventors have made eager investigations on a process for producing a semiconductor device, and an adhesive sheet used in the process. As a result, the inventors find out that the above-mentioned object can be attained by adopting a configuration that will be described below, to complete the invention.

That is, in order to solve the above-mentioned problems, the present invention relates to a process for producing a semiconductor device, comprising a temporarily bonding step of bonding a semiconductor element temporarily on an adherend through an adhesive sheet, a semi-curing step of heating the adhesive sheet under predetermined conditions, thereby turning the sheet into a semi-cured state that the shearing adhering strength of the sheet to the adherend is 0.5 MPa or more, and a wire bonding step of causing the semiconductor element to undergo wire bonding in the state that the adhesive sheet is semi-cured.

In the present invention, a semiconductor element is temporarily bonded onto an adherend through an adhesive sheet, and then this adhesive sheet is heated so as to be turned into a semi-cured state. In the state, the semiconductor element is caused to undergo wire bonding. This process makes it possible to restrain the generation of stress caused by curing shrinkage of the adhesive sheet as much as possible, thereby decreasing a warp generated in the adherend (such as a lead frame, a substrate or a semiconductor element) and cracks generated in the semiconductor element. As a result, the semiconductor element can be made still thinner.

Since the heating is conducted to make the sheet into a semi-cured state, the heating temperature can be set into a low value. As a result, a volatile gas generated from the adhesive sheet can be decreased so as to prevent the existing bonding pads from being contaminated.

The shearing adhering strength of the adhesive sheet in the semi-cured state onto the adherend is 0.5 MPa or more; therefore, even when the wire bonding step is conducted in the temporarily-bonded state, no shear deformation is generated in the adhesive surface between the adhesive sheet and the adherend by ultrasonic vibration or heating in the step. For this reason, the wire bonding can be attained while a fall in the yield is restrained.

The "semi-cured state" refers to a state that the adhesive sheet is not completely cured and the advance of the curing is stopped in such a manner that the wettability of the sheet can be kept even at high temperature. The fixation between the semiconductor element and the adherend through the adhesive sheet is in a state that they are temporarily bonded to each other even after the wire bonding step is finished.

In the above-described process, the adhesive sheet preferably comprises epoxy resin as a thermosetting resin, and when the epoxy loss ratio of the epoxy resin when the epoxy resin is heated at a heating temperature of 175° C. for a heating time of 10 hours is defined as 100%, the epoxy loss ratio in the semi-cured state is 30% or less. This manner makes it possible to restrain the generation of stress caused by curing shrinkage of the adhesive sheet further, thereby preventing the lead frame, substrate or the like from being warped and preventing the semiconductor element from being cracked. Additionally, the heating temperature in the semi-curing step can be set into a lower value, thereby preventing the bonding pads from being contaminated by the generation of a volatile gas from the adhesive sheet.

In the above-described process, the epoxy resin is preferably contained in an amount ranging from 10 to 70% by weight of the whole of one or more resin components including the epoxy resin in the adhesive sheet.

In the above-described process, the heating in the semi-curing step is preferably conducted at a heating temperature ranging from 80 to 170° C. for a heating time ranging from 0.5 to 10 hours. According to the heating conditions, the adhesive sheet is prevented from being completely cured. It is therefore possible to prevent the lead frame, substrate or the like from being warped and preventing the semiconductor element from being cracked by the curing shrinkage of the adhesive sheet. Additionally, the generation of a volatile gas from the adhesive sheet is decreased; thus, the contamination of the bonding pads can also be prevented.

In the above-described process, the adherend is preferably a substrate, a lead frame, or a semiconductor element.

In the above-described process, the method comprises a sealing step of sealing the semiconductor element with a sealing resin, and an after-curing step of after-curing the sealing resin, wherein in at least one of the sealing step and the curing step, heating is conducted to cure the sealing resin and further bond the semiconductor element and the adherend to each other through the adhesive sheet.

In the above-described process, the method comprises the step of laminating, when the adherend is the semiconductor element, a spacer between the semiconductor elements to interpose the adhesive sheet between the spacer and one of the semiconductor elements, wherein the shearing adhering strength of the semi-cured adhesive sheet onto the adhesive sheet is 0.5 MPa or more.

In the above-described process, in at least one of the sealing step and the after-curing step, heating is conducted to cure the sealing resin and further bond the semiconductor element and the spacer to each other through the adhesive sheet.

In the above-described process, the wire bonding step is performed at a temperature ranging from 80 to 250° C. This makes it possible to prevent the semiconductor element and the adherend or the like from being completely bonded to each other by the adhesive sheet in this step.

In the above-described process, the adhesive sheet is an adhesive sheet containing both of a thermosetting resin and a thermoplastic resin.

In the above-described process, as the thermoplastic resin, an acrylic resin. The acrylic resin contains only a small amount of ionic impurities, and has a high heat resistance. Thus, the reliability of the semiconductor element can be certainly kept.

In the above-described process, the thermosetting resin is a preferably phenol resin. The phenol resin contains only a small amount of ionic impurities, and has a high heat resistance. Thus, the reliability of the semiconductor element can be certainly kept.

In the above-described process, the adhesive sheet is preferably an adhesive sheet to which a crosslinking agent is added.

In order to solve the above-mentioned problems, the present invention relates to an adhesive sheet used in the semiconductor-device-producing process.

In the semiconductor-device-producing process of the present invention, a wire bonding step is performed while an adhesive sheet is turned into a semi-cured state; therefore, the adhesive sheet can be restrained from undergoing curing shrinkage in the producing process, thereby preventing the generation of a warp in an adherend, such as a lead frame or substrate, and cracks in the semiconductor element. Additionally, the generation of a volatile gas from the adhesive sheet is restrained as much as possible in the producing process; thus, the contamination of the existing bonding pads can be prevented. Furthermore, the shearing adhering strength of the semi-cured adhesive sheet onto the adherend is 0.5 MPa or more; therefore, in the wire bonding step, shearing deformation is not generated in the adhesive surface between the adhesive sheet and the adherend. In short, according to the present invention, semiconductor devices can be produced in such a manner that the yield is made still better than in the conventional art.

The same effects and advantages as described above are produced in the case of laminating one or more semiconductor elements onto the semiconductor element through the adhesive sheet, or in the case of laminating a spacer between the semiconductor element and a semiconductor element to interpose the adhesive sheet between one of the semiconductor elements and the spacer. The producing process is made simple as described above; therefore, the production efficiency can be further improved in three-dimensional packaging of plural semiconductor elements, or the like.

BRIEF DESCRIPTION OF THE DRAWINGS

Other objects, features and superior points of the present invention will be sufficiently understood from the following description. The advantages of the present invention will be made clear from the following description with reference to the attached drawings.

DESCRIPTION OF THE EMBODIMENTS

Embodiment 1

Figure 1:
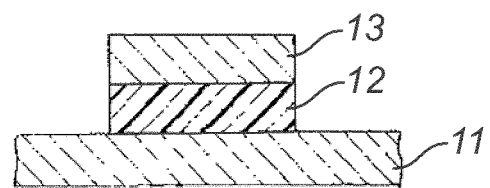
FIGS. 1(a) to 1(c) are process charts to explain the manufacturing method of a semiconductor device in embodiment 1 of the present invention.
Figure 1:
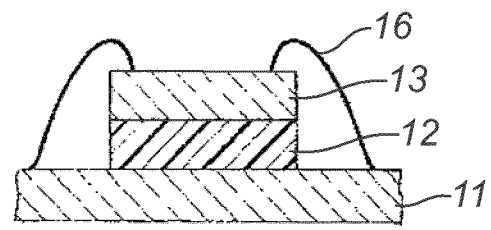
Figure 1:
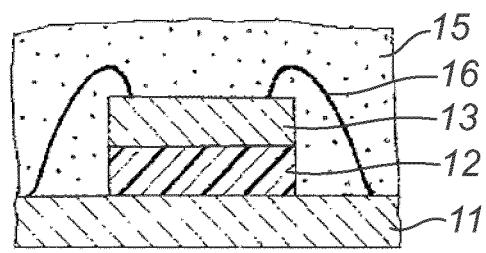

An embodiment of the present invention is described with reference to FIGS. 1(a) to 1(c), which are process charts for explaining a process for producing a semiconductor device according to the present embodiment. In the Figures, however, parts or portions unnecessary for the explanation are omitted and some parts or portions are enlarged, scaled down or modified to make the explanation easily. The same matter is applied to the other drawings.

The process for producing a semiconductor device according to the present embodiment has a temporarily bonding step of bonding a semiconductor element 13 temporarily on a substrate or lead frame (adherend, which will be referred to only as the substrate or the like hereinafter) 11 through an adhesive sheet 12, a semi-curing step of heating the adhesive sheet under predetermined conditions, thereby turning the sheet into a semi-cured state, and a wire bonding step of causing the semiconductor element to undergo wire bonding. Furthermore, the process has a sealing step of sealing the semiconductor element 13 with a sealing resin 15, and an after-curing step of after-curing the sealing resin 15.

As illustrated in FIG. 1(a), the pre-setting step is a step of pre-setting the semiconductor element 13 through the adhesive sheet 12 onto the substrate 11 or the like. The method for pre-setting the semiconductor substrate 13 onto the substrate 11 or the like may be, for example, a method of laminating the adhesive sheet 12 onto the substrate 11 or the like and subsequently laminating and pre-setting the semiconductor element 13 on the adhesive sheet 12 in such a manner that the wire bonding face of the semiconductor element 13 is directed upwards. The semiconductor element 13 on which the adhesive sheet 12 is beforehand pre-set may be pre-set onto the substrate 11 or the like.

The substrate may be any substrate known in the prior art. The lead frame may be a metal lead frame such as a Cu lead frame or a 42-alloy lead frame; or an organic substrate made of glass epoxy resin, BT (bismaleimide-triazine), polyimide or the like. In the present invention, however, the substrate is not limited to these substrates, and may be a circuit substrate that can be used in the state that a semiconductor element is mounted on the substrate itself and is electrically connected thereto.

The semi-curing step is a step of heating the adhesive sheet 12 under predetermined conditions, thereby turning the sheet 12 into a semi-cured state. Conditions for the heating for attaining the semi-curing are appropriately set in accordance with the kinds and the contents of the constituting materials of the adhesive sheet 12. In the embodiment, the heating temperature is from 80 to 170° C., preferably from 80 to 150° C. The period for the heating for attaining the semi-curing is from 0.5 to 10 hours, more preferably from 2 to 8 hours. The heating under the conditions makes it possible to prevent the adhesive sheet 12 from being completely cured, thereby restraining the semiconductor element from bonding completely onto the adherend. If the heating temperature is lower than 80° C. or the heating period is shorter than 0.5 hours, the adhering strength of the adhesive sheet 12 onto the adherend or the semiconductor element is short so that the wire bonding property may deteriorate. On the other hand, if the heating temperature is higher than 170° C. or the heating period is longer than 10 hours, the adhesive sheet 12 undergoes curing shrinkage so that the lead frame or substrate may be warped or the semiconductor element may be cracked. Furthermore, a volatile gas may be generated from the adhesive sheet 12 to contaminate the existing bonding pads.

The shearing adhering strength of the semi-cured adhesive sheet 12 onto the substrate or the like 11 is 0.5 MPa or more, more preferably from 0.5 to 10 MPa. The shearing adhering strength of the adhesive sheet 12 is at least 0.5 MPa; therefore, even when the wire bonding step is conducted without performing any heating step after the semi-curing, shearing deformation is not generated in the adhesive surface between the adhesive sheet 12 and the semiconductor element 13 or the substrate or the like 11 by ultrasonic vibration or heating in the wire bonding step. As a result, the semiconductor element is not moved by the ultrasonic vibration in the wire bonding, so that a fall in the success ratio of the wire bonding can be prevented. The adhesive sheet 12 may be described in detail later.

The wire bonding step is a step of connecting tips of a terminal region (inner lead) in the substrate or the like 11 electrically to electrode pads (not illustrated) on the semiconductor element 13 through bonding wires 16 (see FIG. 1 (b)). For the bonding wires 16, for example, gold wires, aluminum wires, copper wires or the like are used. The temperature for conducting the wire bonding is from 80 to 250° C., preferably from 80 to 220° C. The heating period is from several seconds to several minutes. The wire-connection is attained by use of both of vibration energy based on ultrasonic waves and compression energy based on the application of pressure in the state that the workpiece is heated to a temperature in the above-mentioned range.

The present step is performed without conducting bonding through the adhesive sheet 12. In the step, the semiconductor element 13 and the substrate or the like 11 are not bonded to each other through the adhesive sheet 12, either. The shearing adhering strength of the adhesive sheet 12 needs to be 0.5 MPa or more even in the temperature range of 80 to 250° C. If the shearing adhering strength is less than 0.5 MPa in the temperature range, the semiconductor element is moved by ultrasonic vibration in the wire bonding, so that the wire bonding cannot be attained. As a result, the yield falls.

The above-mentioned sealing step is a step of sealing the semiconductor element 13 with a sealing resin 15 (see FIG. 1(c)), and is performed to protect the semiconductor element 13 and the bonding wires 16 mounted on the substrate 11 or the like. The present step is performed by molding the sealing resin with a mold or die. The sealing resin 15 may be, for example, an epoxy resin.

The heating for the resin-sealing is performed usually at 175° C. for 60 to 90 seconds. In this invention, however, the heating is not limited to this, and may be performed, for example at 165 to 185° C. for several minutes. In such a way, the sealing resin is cured and further the semiconductor element 13 and the substrate 11 or the like are set to each other through the adhesive sheet 12. In short, even if the post-curing step, which will be detailed later, is not performed in this invention, the sticking/fixing based on the adhesive sheet 12 can be attained in the present step so that the number of the producing steps can be reduced and the term for producing the semiconductor device can be shortened.

In the post-curing step, the sealing resin 15, which is not sufficiently cured in the sealing step, is completely cured. Even if the semiconductor element 13 and the substrate 11 or the like are not set to each other through the adhesive sheet 12 in the sealing step, the sealing resin 15 is cured and further they are set through the adhesive sheet 12 in the present step. The heating temperature in the present step is varied dependently on the kind of the sealing resin, and is, for example, in the range of 165 to 185° C. The heating time is from about 0.5 to 8 hours.

The adhesive sheet 12 will be described in detail hereinafter. The adhesive sheet 12 contains a thermosetting resin. The structure thereof is not particularly limited as long as the adhesive sheet 12 can give a shearing adhering strength of 0.5 MPa or more to the adherend when the sheet is in a semi-cured state. Specific examples thereof include an adhesive sheet made only of a single adhesive layer, and a multi-layered adhesive sheet wherein an adhesive layer or adhesive layers is/are formed on a single face or both faces of a core member. Examples of the core member include films (such as polyimide, polyester, polyethylene terephthalate, polyethylene naphthalate, and polycarbonate films); resin substrates which are reinforced with glass fiber or plastic nonwoven finer; silicon substrates; and glass substrates. The core member may be a member wherein an adhesive sheet is integrated with a dicing sheet.

The adhesive sheet 12 may be made of a thermosetting resin and a thermoplastic resin. Further, the adhesive sheet 12 may be made only of a thermoplastic resin.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth)acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

In a case where the adhesive sheet 12 contains an epoxy resin, the epoxy loss ratio of the sheet in a semi-cured state is preferably 30% or less. In a case where the epoxy loss ratio is set to 10% or more, the adhering strength of the semi-cured adhesive sheet 12 onto the adherend can be kept as high as 0.5 MPa or more. Thus, the case is particularly preferred.

The content (by percentage) of the epoxy resin is preferably from 10 to 70% by weight of the whole resin component (s) in the adhesive sheet 12, more preferably from 20 to 60% by weight thereof. If the content is less than 10% by weight, the advantageous effect based on a matter that the sheet is crosslinked becomes small so that the adhering strength at the time of the wire bonding may lower. On the other hand, if the content is more than 70% by weight, the crosslink density becomes too high so that the sheet may not easily express wettability later even when the sheet is in a semi-cured state.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly (p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the adhesive sheet 12 of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the adhesive sheet 12 of the present invention in accordance with the use purpose thereof. The incorporation of the inorganic filler makes it possible to confer electric conductance to the sheet, improve the thermal conductivity thereof, and adjust the elasticity. Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler is preferably from 0.1 to 80 μm.

The amount of the inorganic filler to be incorporated is preferably set into the range of 0 to 80% by weight (more preferably, 0 to 70% by weight) for 100 parts by weight of the organic resin components.

If necessary, other additives besides the inorganic filler may be incorporated into the adhesive sheet 12 of the present invention. Examples thereof include a flame retardant, a silane coupling agent, and an ion trapping agent.

Examples of the curing catalyst include nitrogen-atom-containing compounds such as tertiary amines, imidazoles, imidazolines, diazabicycloalkenes, aliphatic amines and aromatic amines; phosphorus compounds such as triarylphosphines, monoalkyldiarylphosphines, phosphonium salts such as tetraaryl phosphonium tetraallyl borate, and triarylphosphine triarylboron complexes; and metal complexes such as aluminum triacetylacetonate. These may be used alone or in combination of two or more thereof.

The blend amount of the curing catalyst is preferably set into the range of 0.001 to 5.0 parts for 100 parts of the thermosetting resin.

Examples of the flame retardant include antimony trioxide, antimony pentoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

Embodiment 2

A process for producing a semiconductor device according to embodiment 2 is described with reference to FIGS. 2(*a*) to 2(*e*), which are process charts for explaining this process.

The semiconductor device according to the present embodiment is different from the semiconductor device according to the above-mentioned embodiment 1 in that plural semiconductor elements are laminated to be three-dimensionally mounted. More specifically, the present embodiment comprises the step of laminating, on a semiconductor element, another semiconductor element through the adhesive sheet as described above, which is different from the embodiment 1.

Figure 2:
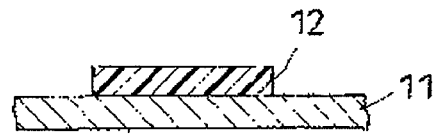
FIGS. 2(a) to 2(e) are process charts to explain the manufacturing method of a semiconductor device in embodiment 2 of the present invention.
Figure 2:
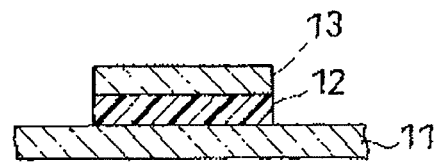
Figure 2:
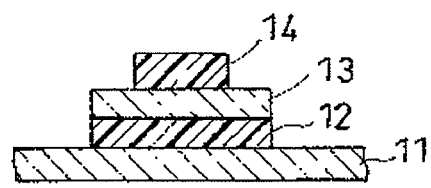
Figure 2:
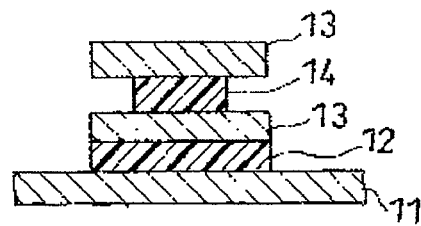
Figure 2:
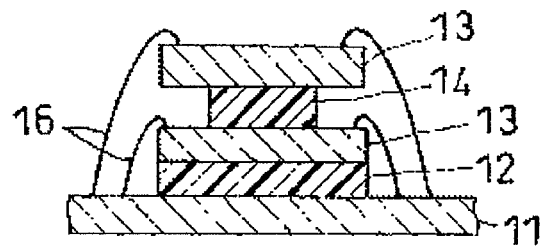

First, as illustrated in FIG. 2(*a*), at least one adhesive sheet 12, which is cut into a given size, is pre-set onto a substrate 11 or the like, which is an object on which the sheet 12 is to be set. Next, a semiconductor element 13 is pre-set onto the adhesive sheet 12 so that the wire bonding face thereof is directed upwards (see FIG. 2(*b*)). Furthermore, an adhesive sheet 14 is pre-set onto the semiconductor element 13 to avoid electrode pad portions of the element 13 (see FIG. 2(*c*)). Another semiconductor element 13 is then formed on the adhesive sheet 14 so that the wire bonding face thereof is directed upwards (see FIG. 2(*d*)).

Next, the adhesive sheets 12 and 14 are heated under the same conditions as described in embodiment 1, so as to be made into a semi-cured state. As illustrated in FIG. 2(*e*), a wire bonding step is further performed. In this way, electrode pads of the semiconductor elements 13 are electrically connected to the substrate or the like 11 through bonding wires 16.

Next, a sealing step of sealing the semiconductor elements 13 with a sealing resin is performed to cure the sealing resin and further to stick/fix the substrate 11 or the like onto one of the semiconductors 13 and stick/fix the semiconductor elements 13 each other through the adhesive sheets 12 and 14. After the sealing step, a post-curing step may be performed.

According to the present embodiment, about the three-dimensional mounting of the semiconductor elements, the production steps thereof can be made simple and the yield thereof can be improved as well, since no heating step based on the heating of the adhesive sheets 12 and 14 is performed. The semiconductor elements can be made even thinner, since the substrate 11 or the like is not warped and the semiconductor elements 13 are not cracked.

Embodiment 3

Figure 3:
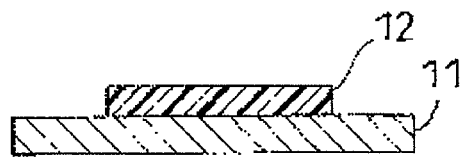
FIGS. 3(a) to 3(g) are process charts to explain the manufacturing method of a semiconductor device in embodiment 3 of the present invention.
Figure 3:
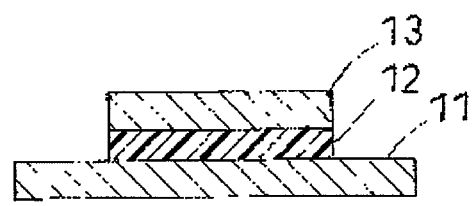
Figure 3:
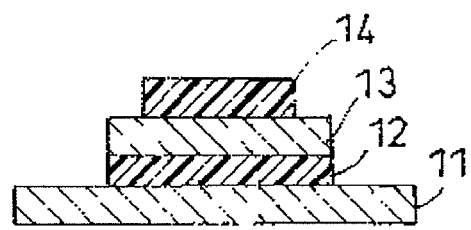
Figure 3:
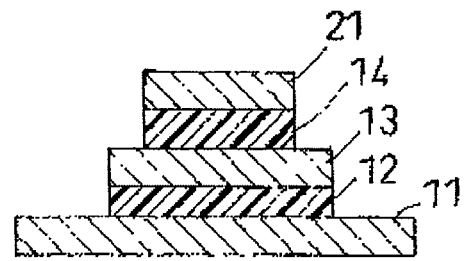
Figure 3:
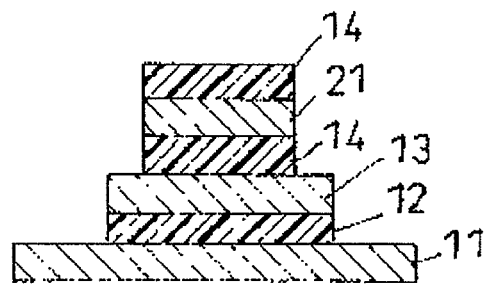
Figure 3:
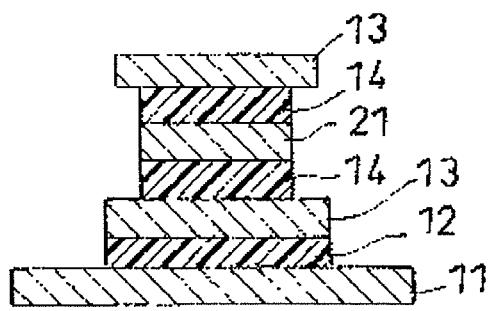
Figure 3:
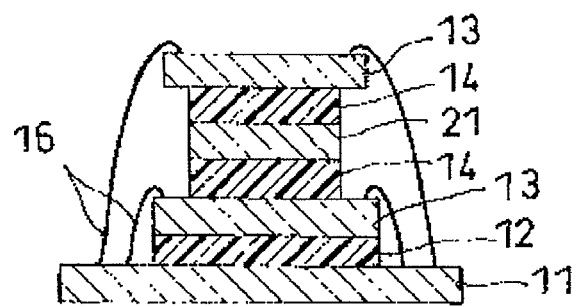

A process for producing a semiconductor device according to embodiment 3 is described with reference to FIGS. 3(*a*) to 3(*g*), which are process charts for explaining this process.

The semiconductor device according to the present embodiment is different from the semiconductor device related to the embodiment 2 in that a spacer is inserted between laminated semiconductor elements. More specifically, the present embodiment comprises the step of inserting a spacer between semiconductor elements in such a manner that an adhesive sheet is interposed between the spacer and each of the semiconductor elements, which is different from the embodiment 2.

First, as illustrated in FIGS. 3(a) to 3(c), an adhesive sheet 12, a semiconductor element 13 and an adhesive sheet 14 are successively laminated and pre-set onto a substrate 11 or the like in the same way as in the embodiment 2. Furthermore, on the adhesive sheet 14, a spacer 21, another adhesive sheet 14 and another semiconductor element 13 are successively laminated and pre-set (see FIGS. 3(d) to 3(f)).

Next, the adhesive sheets 12 and 14 are heated under the same conditions as described in embodiment 1, so as to be made into a semi-cured state. As illustrated in FIG. 3(g), a wire bonding step is further performed. In this way, electrode pads of the semiconductor elements 13 are electrically connected to the substrate or the like 11 through bonding wires 16.

Next, a sealing step of sealing the semiconductor elements with a sealing resin is performed to cure the sealing resin as well as the adhesive sheets 12 and 14, and further bond the substrate or the like 11 onto one of the semiconductor elements 13 and bond the semiconductor elements 13 onto the spacer 21. After the sealing step, an after-curing step may be performed. By performing the above-mentioned producing process, the semiconductor device according to the embodiment can be obtained.

The spacer is not limited to any especial kind, and may be a spacer known in the prior art, such a silicon chip or a polyimide film.

Embodiment 4

A process for producing a semiconductor device according to embodiment 4 is described with reference to FIGS. 4(a) to 4(e), which are process charts for explaining this process.

Figure 4:
FIGS. 4(a) to 4(e) are process charts to explain the manufacturing method of a semiconductor device in embodiment 4 of the present invention.
Figure 4:
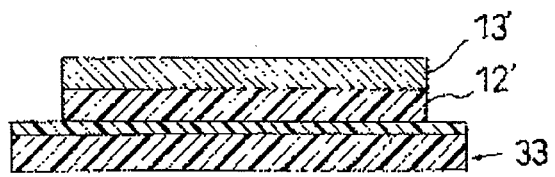
Figure 4:
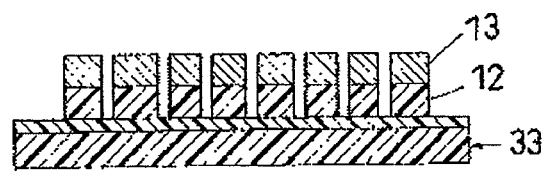
Figure 4:
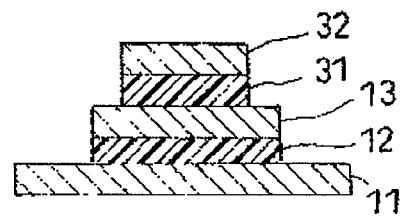
Figure 4:
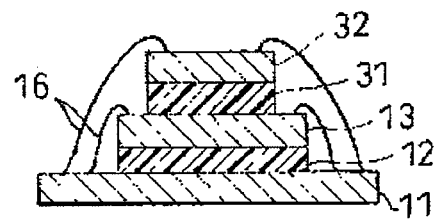

First, as illustrated in FIG. 4(a), an adhesive sheet 12' is stuck onto the rear face of a semiconductor wafer 13' to form a semiconductor wafer with the adhesive sheet. Next, a dicing tape 33 is pre-set onto the semiconductor wafer 13' (see FIG. 4(b)) The semiconductor wafer with the adhesive sheet is then diced into chips each having a given size (see FIG. 4(c)). The chips with the adhesive are peeled from the dicing tape 33.

Next, as illustrated in FIG. 4(d), one 13 of the semiconductor elements with an adhesive sheet 12 is pre-set onto a substrate 11 or the like in such a manner that the wire bonding face thereof is directed upwards. A semiconductor element 32, which has a different size from that of the semiconductor element 13 and has an attached adhesive sheet 31, is pre-set onto the semiconductor element 13 in such a manner that the wire bonding face thereof is directed upwards.

Next, the adhesive sheets 12 and 31 are heated under the same conditions as described in embodiment 1, so as to be made into a semi-cured state. As illustrated in FIG. 4(e), a wire bonding step is further performed. In this way, electrode pads of the semiconductor elements 13 and 32 are electrically connected to the substrate or the like 11 through bonding wires 16.

Next, a sealing step of sealing the semiconductor elements with a sealing resin is performed to cure the sealing resin and further to stick/fix the substrate 11 or the like onto the semiconductor 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

Embodiment 5

A process for producing a semiconductor device according to Embodiment 5 is described with reference to FIGS. 5(a) to 5(e), which are process charts for explaining this process.

The semiconductor device producing process according to the present embodiment is different from the semiconductor device producing process according to the embodiment 4 in that an adhesive sheet 12' is laminated onto a dicing tape 33 and subsequently a semiconductor wafer 13' is laminated onto the adhesive sheet 12'.

Figure 5:
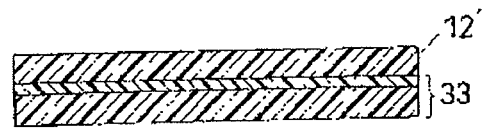
FIGS. 5(a) to 5(e) are process charts to explain the manufacturing method of a semiconductor device in embodiment 5 of the present invention.
Figure 5:
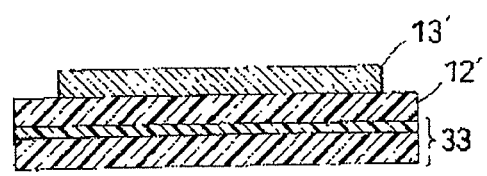
Figure 5:
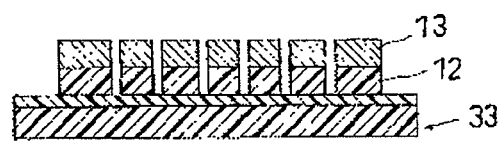
Figure 5:
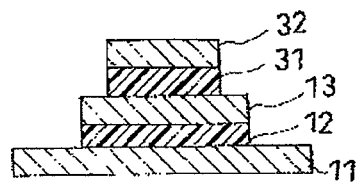
Figure 5:
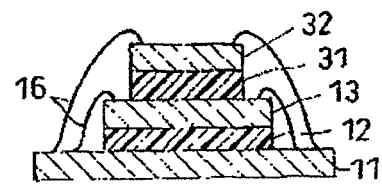

First, as illustrated in FIG. 5(a), an adhesive sheet 12' is laminated onto a dicing tape 33. A semiconductor wafer 13' is then laminated onto the adhesive sheet 12' (see FIG. 5(b)). The semiconductor wafer with the adhesive sheet is then diced into chips each having a given size (see FIG. 5(c)). The chips with the adhesive are peeled from the dicing tape 33.

Next, as illustrated in FIG. 5(d), one 13 of the semiconductor elements with an adhesive sheet piece 12 is pre-set onto a substrate 11 or the like in such a manner that the wire bonding face thereof is directed upwards. A semiconductor element 32, which has a different size from that of the semiconductor element 13 and has an attached adhesive sheet 31, is pre-set onto the semiconductor element 13 in such a manner that the wire bonding face thereof is directed upwards. At this time, the sticking/fixing of the semiconductor element 32 is performed to avoid electrode pad portions of the subjacent semiconductor element 13.

Next, the adhesive sheets 12 and 31 are heated under the same conditions as described in embodiment 1, so as to be made into a semi-cured state. As illustrated in FIG. 5(e), a wire bonding step is further performed. In this way, electrode pads of the semiconductor elements 13 and 32 are electrically connected to lands for internal connection in the substrate or the like 11 through bonding wires 16.

Next, a sealing step of sealing the semiconductor elements with a sealing resin is performed to cure the sealing resin and further to stick/fix the substrate 11 or the like onto the semiconductor element 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

Embodiment 6

Figure 6:
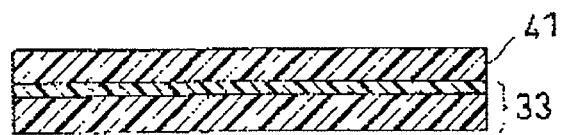
FIGS. 6(a) to 6(c) are process charts to explain the manufacturing method of a semiconductor device in embodiment 6 of the present invention.
Figure 6:
Figure 6:
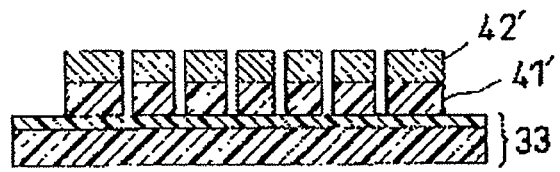
Figure 7:
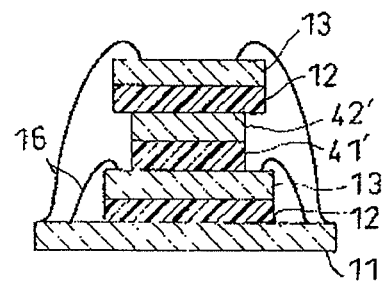
FIG. 7 is a cross-sectional view showing schematics of the semiconductor device obtained by the manufacturing method of a semiconductor device in the embodiment 6.

A process for producing a semiconductor device according to Embodiment 6 is described with reference to FIGS. 6(a) to 6(c) and FIG. 7. FIGS. 6(a) to 6(c) are process charts for explaining this process. FIG. 7 is a sectional view, which schematically illustrates a semiconductor device obtained by the semiconductor device producing process according to the present embodiment.

The semiconductor device according to the present embodiment is different from the semiconductor device according to the embodiment 3 in that a core member is used as a spacer.

First, an adhesive sheet 12' is laminated onto a dicing tape 33 in the same way as in the embodiment 5. A semiconductor wafer 13' is then laminated onto the adhesive sheet 12'. The semiconductor wafer with the adhesive sheet is then diced into chips each having a given size. The chips with the adhesive are peeled from the dicing tape 33, thereby yielding semiconductor elements 13 to each of which an adhesive sheet piece 12 is attached.

Separately, an adhesive sheet 41 is formed on a dicing tape 33, and then a core member 42 is attached onto the adhesive sheet 41. The resultant is then diced into chips each having a given size. The chips with the adhesive are peeled from the dicing tape 33, thereby yielding core member pieces 42' which are each in a chip form and each have an attached adhesive sheet piece 41'.

Next, one of the semiconductor elements 13 is pre-set onto a substrate 11 or the like through the adhesive sheet 12 in such a manner that the wire bonding face thereof is directed upwards. Furthermore, one of the core member 42' is pre-set onto the semiconductor element 13 through the adhesive sheet 41'. Another element out of the semiconductor elements 13 is pre-set onto the core member 42' through the adhesive sheet 12 in such a manner that the wire bonding face thereof is directed upwards. The above-mentioned producing process makes it possible to yield a semiconductor device according to the present embodiment.

Next, the adhesive sheets 12 and 31 are heated under the same conditions as described in embodiment 1, so as to be made into a semi-cured state. A wire bonding step is further performed. In this way, electrode pads of the semiconductor elements 13 are electrically connected to lands for internal connection in the substrate or the like 11 through bonding wires 16 (see FIG. 7).

Next, a sealing step of sealing the semiconductor elements with a sealing resin is performed to cure the sealing resin and further to stick/fix the substrate 11 or the like onto one of the semiconductors element 13 and stick/fix the other semiconductor element 13 onto the core member piece 42' through the adhesive sheet 12 and 41'. After the sealing step, a post-curing step may be performed. The above-mentioned producing process makes it possible to yield a semiconductor device according to the present embodiment. By performing the above-mentioned producing process, the semiconductor device according to the embodiment can be obtained.

The core member is not limited to any especial kind, and may be a core member known in the prior art. Specific examples of the core member include films (such as polyimide film, polyester film, polyethylene terephthalate film, polyethylene naphthalate film, and polycarbonate film); resin substrates which are reinforced with glass fiber or plastic nonwoven finer; mirror silicon wafers; silicon substrates; and glass substrates.

Embodiment 7

Figure 8:
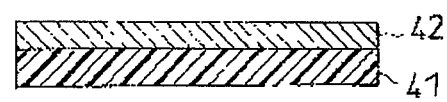
FIGS. 8(a) and 8(b) are process charts to explain the manufacturing method of a semiconductor device in embodiment 7 of the present invention.
Figure 8:
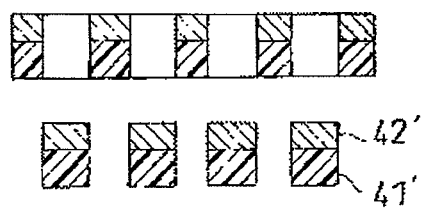

A process for producing a semiconductor device according to Embodiment 7 is described with reference to FIGS. 8(a) and 8(b), which are process charts for explaining this process.

The semiconductor device producing process according to the present embodiment is different from the semiconductor device producing process according to the embodiment 6 in that a core member is made into chips by punching or some other method instead of dicing.

First, semiconductor elements 13 each provided with an adhesive sheet 12 are yielded in the same way as in the embodiment 6. Separately, a core member 42 is attached onto an adhesive sheet 41. The resultant is made into chips each having a given size by punching or some other method. In this way, cores member 42' each of which is in a chip form and provided with an adhesive sheet 41' are yielded.

Next, one of the core member pieces 42' and one of the semiconductor elements 13 are successively laminated on another element out of the semiconductor elements 13 through the adhesive sheet pieces 12 and 41' and then are pre-set in the same way as that of Embodiment 6.

Furthermore, the adhesive sheets 12 and 41' are heated under the same conditions as described in embodiment 1, so as to be made into a semi-cured state. Subsequently, a wire bonding step, a sealing step and an optional after-curing step are performed. In this way, the semiconductor device according to the embodiment can be obtained.

(Other Matters)

When semiconductor elements are three-dimensionally packaged onto a substrate or the like as described above, a buffer coat film is formed on the surface where a circuit of the semiconductor elements is formed. Examples of the buffer coat film include a silicon nitride film, and a film made of a heat-resistant resin such as polyimide resin.

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

The laminating method of each of the above-mentioned embodiments is a mere example, and may be appropriately changed if necessary. For example, in the semiconductor device producing process according to the embodiment 2, the semiconductor elements in the second stage and higher stages may be laminated by the laminating method described about the embodiment 3.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

Example 1

Into methyl ethyl ketone were dissolved 100 parts of an acrylic ester type polymer made mainly of ethyl acrylate and methyl methacrylate (PARACRON W-197CM, manufactured by Negami Chemical Industrial Co., Ltd.), 23 parts of a phenol Novolak type multifunctional epoxy resin (Epikote 152, manufactured by Japan Epoxy Resin Co., Ltd.), and 6 parts of a phenol resin (Milex XLC-CC, manufactured by Mitsui Chemicals, Inc. Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Example 1.

Example 2

An adhesive sheet (thickness: 25 μm) according to Example 2 was formed in the same way as in Example 1 except that a cresol Novolak type multifunctional epoxy resin (YDCN-701, manufactured by Tohto Kasei Co., Ltd.) was used instead of the phenol Novolak type multifunctional epoxy resin used in Example 1.

Comparative Example 1

Into methyl ethyl ketone were dissolved 100 parts of the acrylic ester type polymer made mainly of ethyl acrylate and methyl methacrylate (PARACRON W-197CM, manufactured by Negami Chemical Industrial Co., Ltd.), 23 parts of a bisphenol A type epoxy resin (Epikote 1004, manufactured by Japan Epoxy Resin Co., Ltd.), and 6 parts of the phenol resin (Milex XLC-CC, manufactured by Mitsui Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Comparative Example 1.

Comparative Example 2

An adhesive sheet (thickness: 25 μm) according to Comparative Example 2 was formed in the same way as in Comparative Example 1 except that a bisphenol F type epoxy resin (Epikote 806, manufactured by Japan Epoxy Resin Co., Ltd.) was used instead of the bisphenol A type epoxy resin used in Comparative Example 1.

[Measurement of Shearing Adhering Strength]

About each of the adhesive sheets formed in Examples and Comparative Examples described above, the shearing adhering strength to a substrate, a lead frame or a semiconductor element after the sheet was semi-cured was measured as follows:

First, about the cases of the substrate, lead frame and semiconductor element, various samples were formed as follows:

In the case of the substrate, which was a substrate (trade name: TFBGA 16×16 (2216-001A01), manufactured by UiMicron Technology Corp.), each of the resultant adhesive sheets was peeled from the separator, and then cut into a piece 2 mm square. This piece was used. Separately, an aluminum-evaporated wafer was diced to form a chip 2 mm long×2 mm wide×500 μm thick. This chip was die-attached to the substrate to form a test piece. The die attachment was performed by use of a die bonder (SPA-300, manufactured by Shinkawa Ltd.) under conditions that a load (0.125 MPa) was applied at 120° C. and heating was conducted for 1 second.

In the case of the lead frame, which was a lead frame (trade name: CA-F313 (MF202), manufactured by Shinko Electric Industries Co., Ltd.), a test piece was formed in the same way as about the substrate.

In the case of the semiconductor element, each of the resultant adhesive sheets was peeled from the separator, and then cut into a piece 6 mm square. This piece was used. An element for evaluation (model number: NT-103, manufactured by Phoenix Semiconductor Corp., passivation layer: $Si_3N_4$ (thickness: 5000 Å)), wherein a model pattern for evaluation is formed, was diced into a piece 6 mm long×6 mm wide×500 μm thick. The piece was die-attached to a die pad of a lead frame (trade name: CA-F313 (MF202), manufactured by Shinko Electric Industries Co., Ltd.). Thereafter, the adhesive sheet was cut into a piece 2 mm square, and the piece was used to die-attach a chip obtained by dicing an aluminum-evaporated wafer into a piece 2 mm long×2 mm wide×500 μm thick onto the above-mentioned element for evaluation, so as to produce a test piece. The die attachment was conducted under the same conditions as about the substrate and the lead frame.

After the die attachment of the substrate, the lead frame or the semiconductor element, the adhesive sheets according to Examples 1 and 2 were heated at 150° C. for 2 hours so as to be semi-cured. On the other hand, the adhesive sheets according to Comparative Examples 1 and 2 were not heated, and in the temporarily-bonded state, tests were made.

In the measurement of the shearing adhering strength, each of the test pieces was fixed onto a hot plate, the temperature of which was controllable, and the die-attached semiconductor element was horizontally pushed at a speed of 0.1 mm/second with a push-pull gauge to measure the shearing adhering strength. The measurement was made when the temperature of the hot plate was 80° C., 175° C., and 250° C. The used measuring device was a device (Series 4000 DS100KG) manufactured by DAGE. For reference, the sample was not heated after the die attachment. In the measurement of the shearing adhering strength in the case of the semiconductor element, the aluminum-evaporated semiconductor element of 2 mm square was pushed with the push-pull gauge to measure the shearing adhering strength.

The results are shown in Table 1 described below.

TABLE 1

| | Shearing adhering strength (MPa) | | | | | | | | |
|---|---|---|---|---|---|---|---|---|---|
| | Lead frame | | | Substrate | | | Semiconductor element | | |
| | Hot plate temperature (° C.) | | | | | | | | |
| | 80 | 175 | 250 | 80 | 175 | 250 | 80 | 175 | 250 |
| Example 1 | 1.0 | 0.8 | 0.5 | 1.1 | 0.6 | 0.5 | 1.0 | 0.7 | 0.6 |
| Example 2 | 0.8 | 0.7 | 0.6 | 1.0 | 0.6 | 0.5 | 0.9 | 0.7 | 0.6 |
| Comparative Example 1 | 0.2 | 0.1 | 0.0 | 0.1 | 0.1 | 0.0 | 0.1 | 0.1 | 0.0 |
| Comparative Example 2 | 0.2 | 0.1 | 0.0 | 0.2 | 0.2 | 0.1 | 0.2 | 0.2 | 0.1 |

As shown in Table 1, the adhesive sheets according to Examples 1 and 2 exhibited a shearing adhering strength of 0.5 MPa or more at each of the hot plate temperatures. On the other hand, the shearing adhering strength of the adhesive sheets according to Comparative Examples 1 and 2 was 0.2 MPa at largest.

[Wire Bonding Property]

The adhesive sheets of the Examples and the Comparative Examples were each used to evaluate the wire bonding property in the case of using a semiconductor element, and a lead frame, substrate or semiconductor element.

First, about the cases of the substrate, lead frame and semiconductor element, various samples were formed as follows:

In the case of the substrate, which was a substrate (trade name: TFBGA 16×16 (2216-001A01), manufactured by UiMicron Technology Corp.), each of the resultant adhesive sheets was peeled from the separator, and then cut into a piece 6 mm square. This piece was used. Separately, an aluminum-evaporated wafer was diced to form a chip 6 mm long×6 mm wide×100 μm thick. This chip was die-attached to the substrate to form a test piece. The die attachment was performed by use of a die bonder (SPA-300, manufactured by Shinkawa Ltd.) under conditions that a load (0.125 MPa) was applied at 120° C. and heating was conducted for 1 second.

In the case of the lead frame, which was a lead frame (trade name: CA-F313 (MF202), manufactured by Shinko Electric Industries Co., Ltd.), each of the adhesive sheets was peeled from the separator, and then cut into a piece 7.5 mm square. This piece was used. Separately, an aluminum-evaporated wafer was diced to form a chip 7.5 mm long×7.5 mm wide× 100 μm thick. This chip was die-attached to the substrate to form a test piece. The die attachment was performed under the same conditions as about the substrate.

In the case of the semiconductor element, each of the resultant adhesive sheets was peeled from the separator, and then cut into a piece 6 mm square. This piece was used. An element for evaluation (model number: NT-103, manufactured by Phoenix Semiconductor Corp., passivation layer: $Si_3N_4$ (thickness: 5000 Å)), wherein a model pattern for evaluation is formed, was diced into a piece 6 mm long×6 mm wide×100 μm thick. The piece was die-attached to a die pad of a lead frame (trade name: CA-F313 (MF202), manufactured by Shinko Electric Industries Co., Ltd.). This element for evaluation was called a first semiconductor element. The above-mentioned adhesive sheet was cut into a piece 5 mm square, and the piece was used to die-attach a chip obtained by dicing an aluminum-evaporated wafer into a piece 5 mm long×5 mm wide×100 μm thick onto the above-mentioned element for evaluation, so as to produce a test piece. This chip was called a second semiconductor element. About each of the above-mentioned samples, finally, 20 equivalents were produced.

Next, about the various samples, wire bonding gold wires (diameter: 25 μm) were bonded thereto by ultrasonic thermocompression bonding. The number of wire bonds per sample was set to 80. Conditions for the wire bonding were as follows: the ultrasonic outputting time was 10 ms, the ultrasonic power was 120, the bond load was 980 mN, and the stage temperature was set to 80, 175 and 250° C. The used wire bonding device was a device (UTC-300) manufactured by Shinkawa Ltd. About the evaluation of the success ratio of the wire bonds, a case where the pull strength obtained by a tension gauge was 5 g or more was judged as success. In the case of the semiconductor element, the second semiconductor element and the lead frame were caused to undergo wire bonding. The results are shown in Table 2 described below.

TABLE 2

| | Wire bond success ratio (%) | | | | | | | | |
|---|---|---|---|---|---|---|---|---|---|
| | Lead frame | | | Substrate | | | Semiconductor element | | |
| | Wire bonding temperature (° C.) | | | | | | | | |
| | 80 | 175 | 250 | 80 | 175 | 250 | 80 | 175 | 250 |
| Example 1 | 100 | 100 | 100 | 100 | 100 | 100 | 100 | 100 | 100 |
| Example 2 | 100 | 100 | 100 | 100 | 100 | 100 | 100 | 100 | 100 |
| Comparative Example 1 | 0 | 0 | 0 | 0 | 0 | 0 | 0 | 0 | 0 |
| Comparative Example 2 | 0 | 0 | 0 | 0 | 0 | 0 | 0 | 0 | 0 |

As shown in Table 2, about the adhesive sheets according to Examples 1 and 2, the success ratio was 100% at each of the hot plate temperatures. On the other hand, about the adhesive sheets according to Comparative Examples 1 and 2, the ratio was 0%. The reason why about the adhesive sheets according to Examples 1 and 2, the success ratio was 100% is that each of the sheets had a sufficient shearing adhering strength, whereby no chip got out of position.

[Epoxy Loss Ratio]

The loss ratio of epoxy groups in the resin component(s) contained in each of the adhesive sheets of the Examples and the Comparative Examples was measured by IR.

First, about the cases of a substrate, a lead frame, and a semiconductor element, various samples were formed as follows: In the case of the substrate, which was a substrate (trade name: TFBGA 16×16 (2216-001A01), manufactured by UiMicron Technology Corp.), each of the resultant adhesive sheets was peeled from the separator, and then cut into a piece 6 mm square. This piece was used. Separately, an aluminum-evaporated wafer was diced to form a chip 6 mm long×6 mm wide×100 μm thick. This chip was die-attached to the substrate to form a test piece. The die attachment was performed by use of a die bonder (SPA-300, manufactured by Shinkawa Ltd.) under conditions that a load (0.125 MPa) was applied at 120° C. and heating was conducted for 1 second. Furthermore, the test piece was heated at 150° C. for a predetermined period, and then only the adhesive sheet was withdrawn. A device (NEXUS 670) manufactured by Thermo Electron was used to subject the sample to FT-IR analysis.

About the evaluation of the epoxy loss ratio, the absorbance of each the adhesive sheets in the state that the sheet was not heated at all was regarded as 0%, and that of the adhesive sheet cured at 175° C. for 10 hours was regarded as 100%. From the ratio between the absorbances of the sample, the epoxy loss ratio was calculated at every curing time shown in Table 3 described below.

TABLE 3

| | Epoxy loss ratio (%) | | | | | | |
|---|---|---|---|---|---|---|---|
| | 0 hour | 0.5 hours | 1 hour | 2 hours | 5 hours | 8 hours | 10 hours |
| Example 1 | 0 | 3 | 5 | 10 | 20 | 28 | 30 |
| Example 2 | 0 | 3 | 5 | 10 | 20 | 28 | 30 |
| Comparative Example 1 | 0 | 8 | 15 | 30 | 50 | 72 | 75 |
| Comparative Example 2 | 0 | 8 | 15 | 30 | 50 | 72 | 75 |

What is claimed is:

1. A process for producing a semiconductor device, comprising:
    a temporarily bonding step of bonding a semiconductor element temporarily on an adherend through an adhesive sheet,
    a semi-curing step of heating the adhesive sheet under predetermined conditions, thereby turning the sheet into a semi-cured state such that the shearing adhering strength of the sheet to the adherend is 0.5 MPa or more, and
    a wire bonding step of causing the semiconductor element to undergo wire bonding in the state that the adhesive sheet is semi-cured,
    wherein the heating in the semi-curing step is conducted at a heating temperature ranging from 80 to 170° C. for a heating time ranging from 0.5 to 10 hours.

2. The process for producing a semiconductor device according to claim 1, wherein the adhesive sheet comprises epoxy resin as a thermosetting resin, and
    when the epoxy loss ratio of the epoxy resin when the epoxy resin is heated at a heating temperature of 175° C. for a heating time of 10 hours is defined as 100%, the epoxy loss ratio in the semi-cured state is 30% or less.

3. The process for producing a semiconductor device according to claim 2, wherein the epoxy resin is contained in an amount ranging from 10 to 70% by weight of the whole of one or more resin components including the epoxy resin in the adhesive sheet.

4. The process for producing a semiconductor device according to claim 1, wherein the adherend is a substrate, a lead frame, or a second semiconductor element.

5. The process for producing a semiconductor device according to claim 4, comprising the step of laminating, when the adherend is the second semiconductor element, a spacer between the second semiconductor element and the adhesive sheet to interpose the adhesive sheet between the spacer and the second semiconductor element, wherein the process further comprises laminating a second adhesive sheet on the spacer to interpose a second adhesive sheet between the spacer and the first semiconductor element, and wherein the shearing adhering strength of the semi-cured adhesive sheet onto the adhesive sheet is 0.5 MPa or more.

6. The process for producing a semiconductor device according to claim 5, wherein in at least one of a sealing step and an after-curing step, heating is conducted to cure the sealing resin and further bond the semiconductor element and the spacer to each other through the adhesive sheet.

7. The process for producing a semiconductor device according to claim 1, comprising a sealing step of sealing the semiconductor element with a sealing resin, and an after-curing step of after-curing the sealing resin, wherein in at least one of the sealing step and the curing step, heating is conducted to cure the sealing resin and further bond the semiconductor element and the adherend to each other through the adhesive sheet.

8. The process for producing a semiconductor device according to claim 1, wherein the wire bonding step is performed at a temperature ranging from 80 to 250° C.

9. The process for producing a semiconductor device according to claim 1, wherein the adhesive sheet is an adhesive sheet containing both of a thermosetting resin and a thermoplastic resin.

10. The process for producing a semiconductor device according to claim 9, wherein the thermoplastic resin is an acrylic resin.

11. The process for producing a semiconductor device according to claim 10, wherein the thermosetting resin is a phenol resin.

12. The process for producing a semiconductor device according to claim 9, wherein the thermosetting resin is a phenol resin.

13. The process for producing a semiconductor device according to claim 9, wherein the adhesive sheet is an adhesive sheet to which a crosslinking agent is added.

14. The process for producing a semiconductor device according to claim 1, wherein the shearing adhering strength of the sheet to the adherend is 0.5 MPa to 1.1 MPa.

15. The process for producing a semiconductor device according to claim 1 wherein the heating in the semi-curing step is performed at a temperature wherein volatile gasses evolved from the adhesive sheet are present in an amount such that the volatile gasses do not adversely affect the wire-bonding step.

* * * * *

UNITED STATES PATENT AND TRADEMARK OFFICE
CERTIFICATE OF CORRECTION

| | | |
|---|---|---|
| PATENT NO. | : 8,592,260 B2 | Page 1 of 1 |
| APPLICATION NO. | : 12/492641 | |
| DATED | : November 26, 2013 | |
| INVENTOR(S) | : Oikawa et al. | |

It is certified that error appears in the above-identified patent and that said Letters Patent is hereby corrected as shown below:

On the Title Page

In column 2 (page 1, Assistant Examiner) at line 1, Change "Daniel Shock" to --Daniel Shook--.

In the Specification

In column 8 at line 38, Change "Novolak" to --Novalac--.

In column 8 at line 38, Change "Novolak" to --Novalac--.

In column 8 at line 39, Change "tetraphenylolethane" to --tetraphenylethane--.

In column 8 at line 40, Change "tris-glycicylisocyanurate" to --tris-glycidylisocyanurate--.

In column 8 at line 44, Change "Novolak" to --Novalac--.

In column 8 at lines 45-46, Change "tetraphenylolethane" to --tetraphenylethane--.

In column 8 at line 50, Change "Novolak" to --Novalac--.

In column 8 at line 51, Change "Novolak" to --Novalac--.

In column 8 at line 52, Change "Novolak" to --Novalac--.

In column 8 at line 52, Change "Novolak" to --Novalac--.

In column 8 at line 53, Change "Novolak" to --Novalac--.

In column 8 at line 56, Change "Novolak" to --Novalac--.

In column 14 at line 50, Change "Novolak" to --Novalac--.

In column 14 at line 67, Change "Novolak" to --Novalac--.

In column 15 at line 2, Change "Novolak" to --Novalac--.

In column 15 at line 41, Change "UiMicron" to --UniMicron--.

In column 16 at line 56, Change "UiMicron" to --UniMicron--.

In column 18 at line 11, Change "UiMicron" to --UniMicron--.

Signed and Sealed this
Twenty-sixth Day of August, 2014

Michelle K. Lee
*Deputy Director of the United States Patent and Trademark Office*